US012046271B2

(12) United States Patent
Cheng

(10) Patent No.: US 12,046,271 B2
(45) Date of Patent: Jul. 23, 2024

(54) CLOCK SYSTEM AND MEMORY

(71) Applicant: CHANGXIN MEMORY TECHNOLOGIES, INC., Hefei (CN)

(72) Inventor: Jingwei Cheng, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 18/509,485

(22) Filed: Nov. 15, 2023

(65) Prior Publication Data

US 2024/0079044 A1 Mar. 7, 2024

Related U.S. Application Data

(63) Continuation of application No. PCT/CN2022/132406, filed on Nov. 17, 2022.

(30) Foreign Application Priority Data

Aug. 31, 2022 (CN) .......................... 202211065406.9

(51) Int. Cl.
*G11C 7/22* (2006.01)
*G11C 7/10* (2006.01)
(Continued)

(52) U.S. Cl.
CPC ........ *G11C 11/4076* (2013.01); *G11C 7/1093* (2013.01); *G11C 7/222* (2013.01);
(Continued)

(58) Field of Classification Search
CPC ... G11C 11/4076; G11C 7/1093; G11C 7/222; G11C 29/023; H03L 7/093; H03L 7/0992
See application file for complete search history.

(56) References Cited

U.S. PATENT DOCUMENTS 6,014,047 A 1/2000 Dreps et al.
2007/0101177 A1 5/2007 Kuroki
(Continued)

FOREIGN PATENT DOCUMENTS

CN 1222791 A 7/1999
CN 103532522 A 1/2014
(Continued)

OTHER PUBLICATIONS

International Search Report cited in PCT/CN2022/132406 mailed May 12, 2023, 15 pages.

*Primary Examiner* — Mushfique Siddique
(74) *Attorney, Agent, or Firm* — Kilpatrick Townsend & Stockton LLP

(57) ABSTRACT

A clock system and a memory are disclosed. The clock system includes a system on chip (SoC) configured to generate a first oscillation signal, a second oscillation signal, a third oscillation signal and a fourth oscillation signal of a same frequency and amplitude. Further, the clock system includes a memory chip configured to output a data signal based on signal edges of the first oscillation signal, the second oscillation signal, the third oscillation signal and the fourth oscillation signal, and output a command/address signal based on the signal edges of the first oscillation signal and the third oscillation signal. The signal edges are rising edges or falling edges.

16 Claims, 6 Drawing Sheets

(51) Int. Cl.
  *G11C 11/4076*   (2006.01)
  *G11C 29/02*   (2006.01)
  *H03L 7/093*   (2006.01)
  *H03L 7/099*   (2006.01)
(52) U.S. Cl.
  CPC ............ *G11C 29/023* (2013.01); *H03L 7/093* (2013.01); *H03L 7/0992* (2013.01)

(56) References Cited

U.S. PATENT DOCUMENTS

| | | | |
|---|---|---|---|
| 2009/0154285 A1* | 6/2009 | Pyeon | G11C 7/20 365/233.1 |
| 2011/0267117 A1* | 11/2011 | Choi | H03L 7/00 327/156 |
| 2018/0204608 A1* | 7/2018 | Polney | G11C 7/109 |
| 2019/0172512 A1* | 6/2019 | Oh | G11C 29/1201 |
| 2019/0180803 A1 | 6/2019 | Jung et al. | |
| 2019/0333553 A1* | 10/2019 | Choi | G11C 7/1093 |
| 2022/0148634 A1 | 5/2022 | Choi et al. | |
| 2023/0026320 A1* | 1/2023 | Kim | G11C 11/4093 |
| 2023/0029968 A1* | 2/2023 | Chang | H03K 5/1565 |

FOREIGN PATENT DOCUMENTS

| | | |
|---|---|---|
| CN | 114253345 A | 3/2022 |
| CN | 114464226 A | 5/2022 |

\* cited by examiner

CLOCK SYSTEM AND MEMORY

CROSS-REFERENCE TO RELATED APPLICATIONS

This is a continuation of International Patent Application No. PCT/CN2022/132406, filed on Nov. 17, 2022, which claims the priority to Chinese Patent Application No. 202211065406.9, titled "CLOCK ARCHITECTURE OF MEMORY AND MEMORY" and filed on Aug. 31, 2022. The disclosures of International Patent Application No. PCT/CN2022/132406 and Chinese Patent Application No. 202211065406.9 are incorporated herein by reference in their entireties.

TECHNICAL FIELD

The present disclosure relates to, but is not limited to, a clock system and a memory.

BACKGROUND

For low-power double data rate 5 (LPDDR5) type memories, data is read out based on double-edge sampling of read clocks RDQS_t and RDQS_c during the period of data reading, and data is written based on double-edge sampling of write clocks WCK_t and WCL_c during the period of data writing. During the period of inputting a command/address signal CA, the input control of the command/address signal is realized based on double-edge sampling of address/command clocks CK_t and CK_c.

In one example, for an 8-pin 4-channel LPDDR5 memory, a data read/write rate of 6400 Mbps in a storage mode is taken as an example, and the data rate of 6400 Mbps is defined as a data DQ rate transmitted on a data input/output bus of the memory is about 6400 Mbps. The data is sampled based on a double-edge clock, that is, the frequencies of the read clocks RDQS_t and RDQS_c and the write clocks WCK_t and WCL_c are about 3200 MHz. During a high-speed data transmission process of the LPDDR5 memory, the frequencies of the read clocks RDQS_t and RDQS_c and the write clocks WCK_t and WCL_c are about 4 times the frequencies of the address/command clocks CK_t and CK_c, that is, the frequencies of the address/command clocks CK_t and CK_c is about 800 MHz. The address/command signal CA is also sampled on double edges, that is, a data rate of the address/command signal is about 1600 Mbps.

It can be seen from the above example that the LPDDR5 memory can process high-speed data with a lower clock frequency by sampling double edges of the address/command signal and read/write data, which improves the data storage speed of the memory. However, the data mode based on double-edge sampling, the change of a duty cycle of the clock signal has significant effect on eye diagrams of a read operation and a write operation, and it is necessary to additionally adjust the duty cycle of the clock signal to stabilize the duty cycle of each clock signal. In addition, in this sampling mode, the synchronization of the read clocks RDQS_t and RDQS_c, the synchronization of the write clocks WCK_t and WCL_c, and the synchronization of the address/command clocks CK_t and CK_c are required, which affects the subsequent improvement of the read rate and write rate of the memory to a certain extent.

SUMMARY

An overview of the subject described in detail in the present disclosure is provided below, which is not intended to limit the protection scope of the claims.

The present disclosure provides a clock system and a memory, avoiding the synchronization of the clock signal and the influence of the duty cycle on the reading and writing of the memory while completing high-speed data processing through a low-speed clock signal.

A first aspect of the present disclosure provides a clock system and a memory, including: a system on chip configured to generate a first oscillation signal, a second oscillation signal, a third oscillation signal and a fourth oscillation signal of a same frequency and amplitude, where the phase difference between the first oscillation signal and the second oscillation signal is 90°, the phase difference between the first oscillation signal and the third oscillation signal is 180°, and the phase difference between the first oscillation signal and the fourth oscillation signal is 270°; and a memory chip configured to output a data signal based on signal edges of the first oscillation signal, the second oscillation signal, the third oscillation signal and the fourth oscillation signal, and further configured to output a command/address signal based on the signal edges of the first oscillation signal and the third oscillation signal, where the signal edges are rising edges or falling edges.

A second aspect of the present disclosure provides a memory, constructed based on the clock system provided in the above embodiment, for outputting a data signal and a command/address signal.

Other aspects of the present disclosure are understandable upon reading and understanding of the accompanying drawings and detailed description.

BRIEF DESCRIPTION OF DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

In the drawings.

Figure 1:
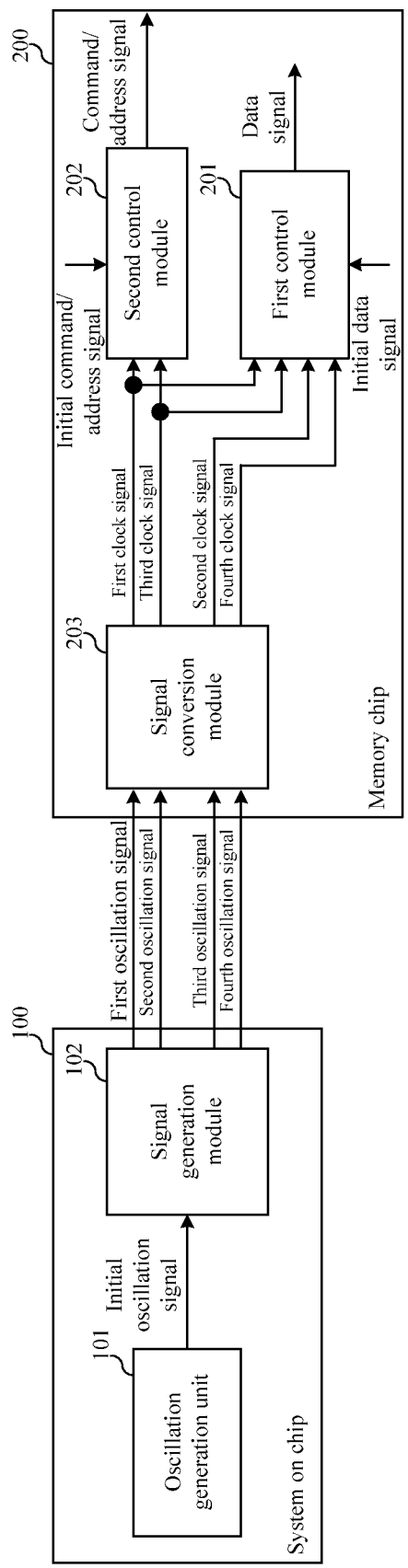
FIG. 1 is a schematic structural diagram of a clock system according to an embodiment of the present disclosure.

100. System on chip (SoC); 101. Oscillation generation unit; 102. Signal generation module; 200. Memory chip; 201. First control module; 202. Second control module; 203. Signal conversion module; 301. Phase detector; 302. Low-pass filter; 303. Voltage-controlled oscillator; 304. Feedback divider; 401. First frequency divider; 402. Second frequency divider; 501. First data module; 502. Second data module; 503. Third data module; 504. Fourth data module; 601. First command/address module; 602. Second command/address module;

F1. First inverter; F2. Second inverter; F3. Third inverter; F4. Fourth inverter; F5. Fifth inverter; F6. Sixth inverter; F7. Seventh inverter; F8. Eighth inverter; S1. First output inverter; S2. Second output inverter; S3. Third output inverter; S4. Fourth output inverter; S5. Output inverter; Q1. First driver; Q2. Second driver; Q3. Third driver; P1. First P-type transistor; P2. Second P-type transistor; N1. First N-type transistor; N2. Second N-type transistor; K1. First switching transistor; K2. Second switching transistor; K3. Third switching transistor; K4. Fourth switching transistor; T1. First adjustment transistor; T2. Second adjustment transistor; W1. First reset transistor; and W2. Second reset transistor.

DESCRIPTION OF EMBODIMENTS

The technical solutions in the embodiments of the present disclosure are described below clearly and completely referring to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

It can be seen from the background that the LPDDR5 type memories can process high-speed data with a lower clock frequency by sampling double edges of the address/command signal and the read data and write data, which improves the data storage speed of the memory. However, based on the data mode of double-edge sampling, the change of a duty cycle of the clock signal has a significant effect on eye diagrams of a read operation and a write operation, and it is necessary to additionally adjust the duty cycle of the clock signal to stabilize the duty cycle of each clock signal. In addition, in this sampling mode, the synchronization of the read clocks RDQS_t and RDQS_c, the synchronization of the write clocks WCK_t and WCL_c, and the synchronization of the address/command clocks CK_t and CK_c are required, which affects the subsequent improvement of the read rate and write rate of the memory to a certain extent.

An embodiment of the present disclosure provides a clock system, avoiding the effect of the synchronization of the clock signals and the duty cycle on reading and writing of the memory, at the same time realizing high-speed data processing by using low-speed clock signals.

Figure 2:
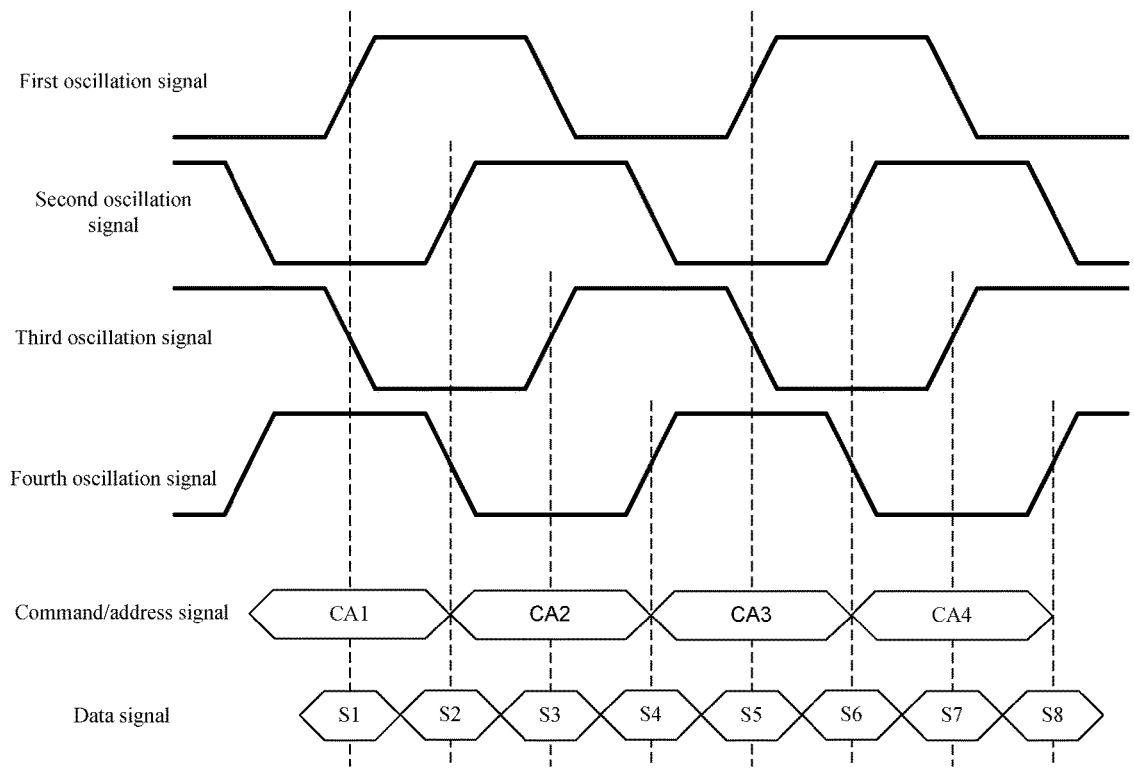
FIG. 2 is a timing schematic diagram of inputting a data signal and a command/address signal by a memory chip based on a first oscillation signal, a second oscillation signal, a third oscillation signal and a fourth oscillation signal according to an embodiment of the present disclosure.
Figure 3:
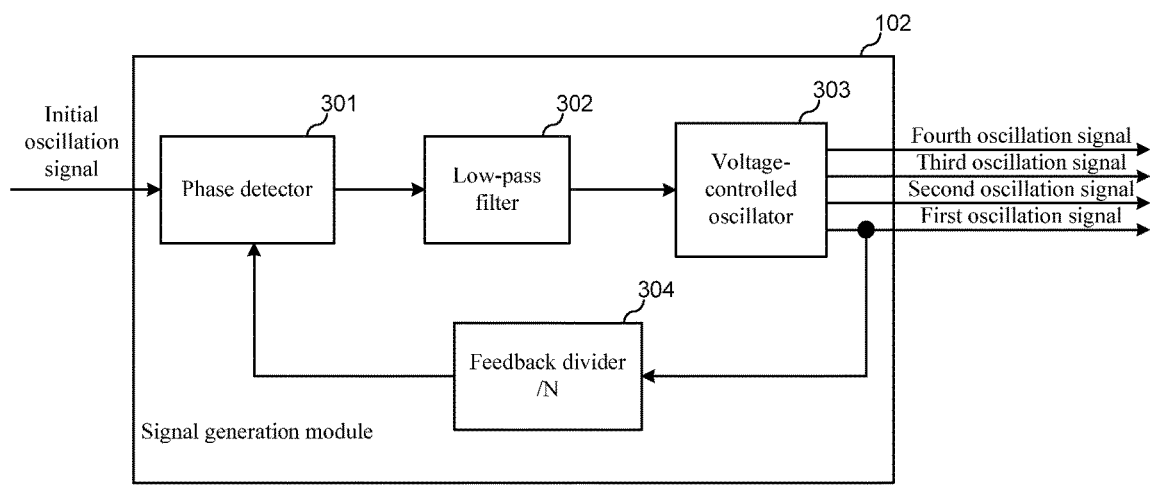
FIG. 3 is a schematic structural diagram of a signal generation module according to an embodiment of the present disclosure.
Figure 4:
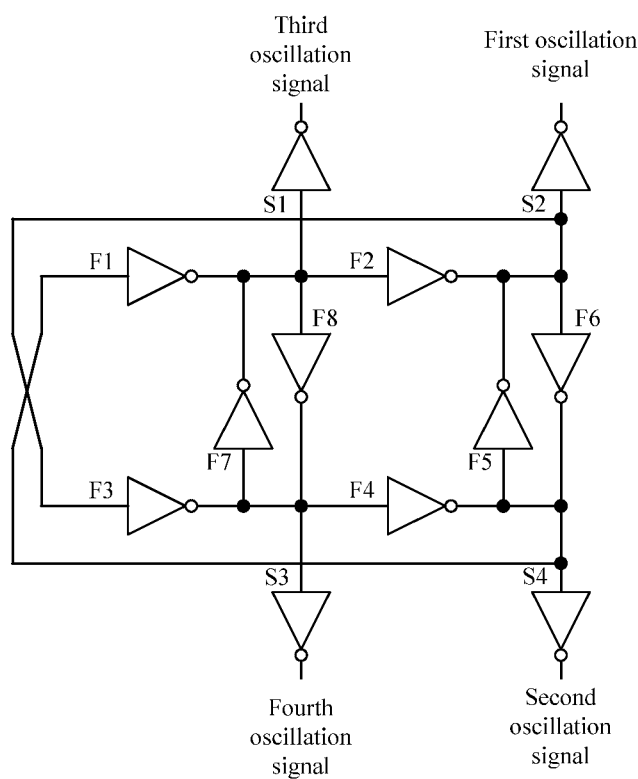
FIG. 4 is a schematic structural diagram of a voltage-controlled oscillator according to an embodiment of the present disclosure.
Figure 5:
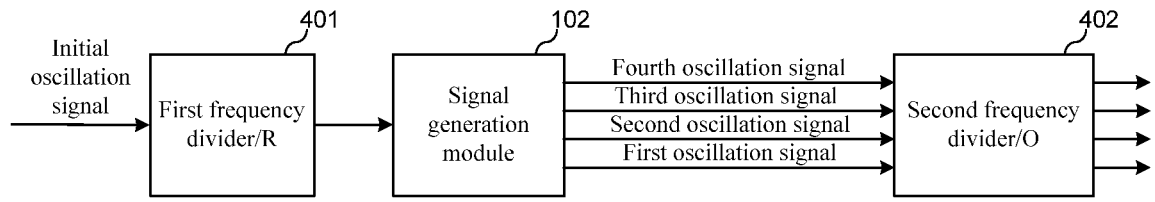
FIG. 5 is a schematic diagram of connection relations among a first frequency divider, a second frequency divider, and a signal generation module according to an embodiment of the present disclosure.
Figure 6:
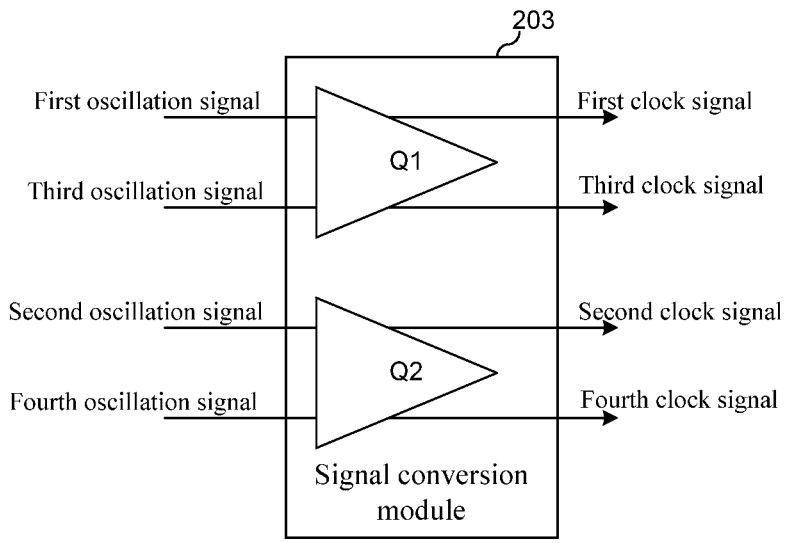
FIG. 6 is a schematic structural diagram of a signal conversion module according to an embodiment of the present disclosure.
Figure 7:
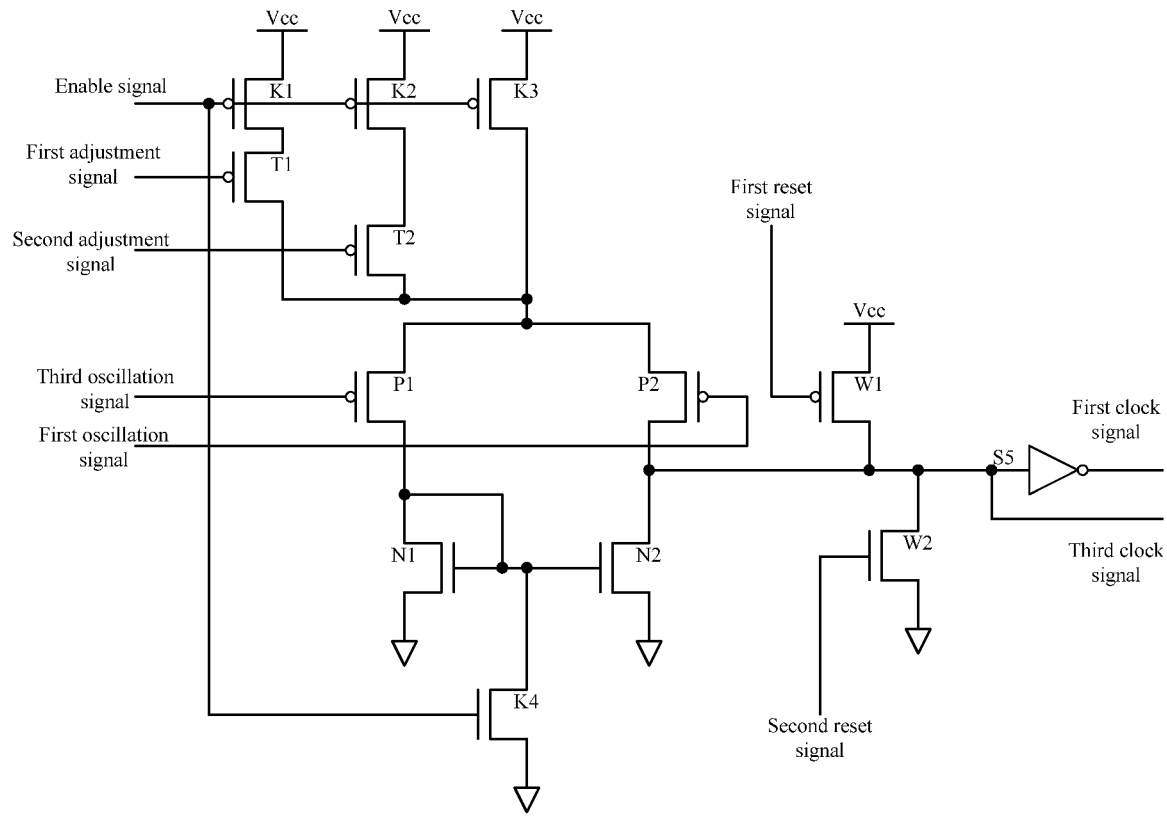
FIG. 7 is a schematic structural diagram of a circuit of a first driver according to an embodiment of the present disclosure.
Figure 8:
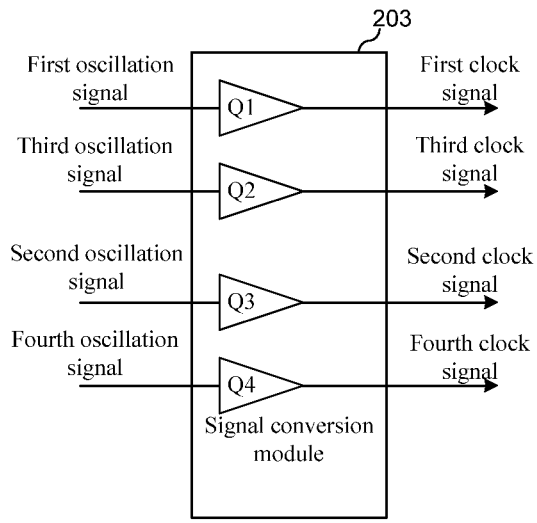
FIG. 8 is a schematic structural diagram of another signal conversion module according to an embodiment of the present disclosure.
Figure 9:
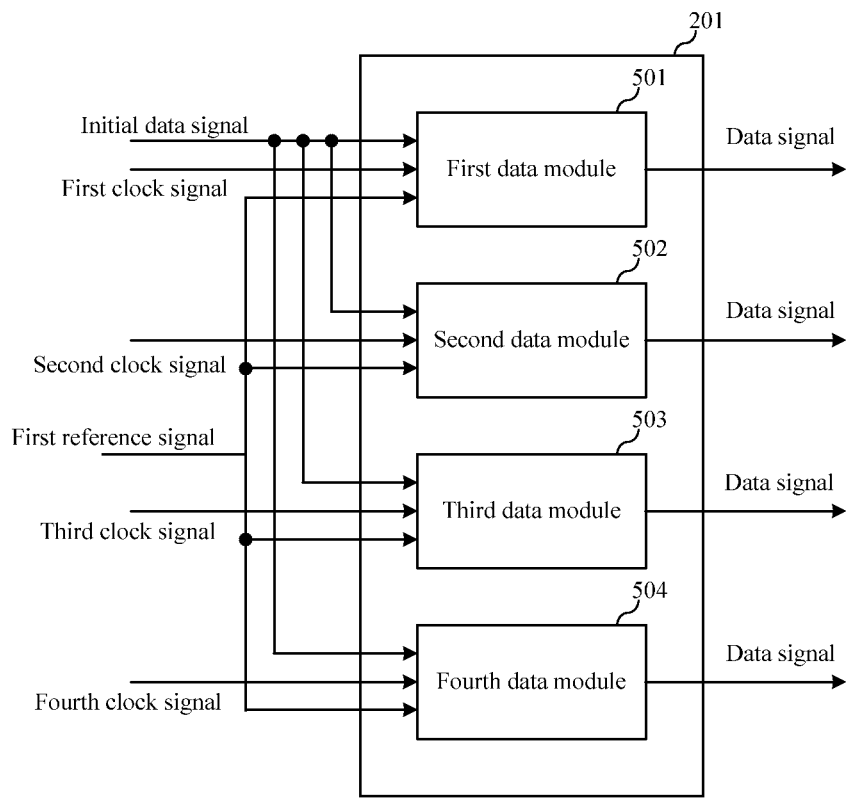
FIG. 9 is a schematic structural diagram of a first control module according to an embodiment of the present disclosure.
Figure 10:
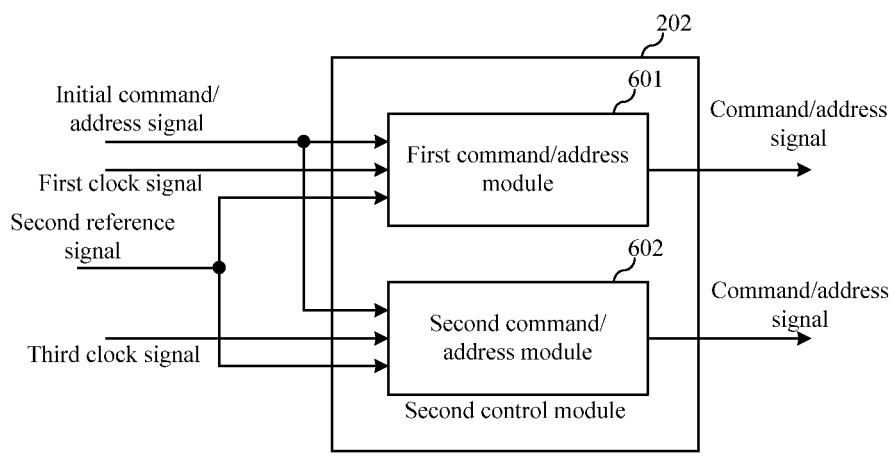
FIG. 10 is a schematic structural diagram of a second control module according to an embodiment of the present disclosure.

FIG. 1 is a schematic structural diagram of a clock system according to this embodiment. FIG. 2 is a timing schematic diagram of inputting a data signal and a command/address signal by a memory chip based on a first oscillation signal, a second oscillation signal, a third oscillation signal and a fourth oscillation signal according to this embodiment. FIG. 3 is a schematic structural diagram of a signal generation module according to this embodiment. FIG. 4 is a schematic structural diagram of a voltage-controlled oscillator according to this embodiment. FIG. 5 is a schematic diagram of connection relations among a first frequency divider, a second frequency divider, and a signal generation module according to this embodiment. FIG. 6 is a schematic structural diagram of a signal conversion module according to this embodiment. FIG. 7 is a schematic structural diagram of a circuit of a first driver according to this embodiment. FIG. 8 is a schematic structural diagram of another signal conversion module according to this embodiment. FIG. 9 is a schematic structural diagram of a first control module according to this embodiment. FIG. 10 is a schematic structural diagram of a second control module according to this embodiment. The clock system provided in this embodiment is described below in detail with reference to the accompanying drawings, and the details are as follows:

Referring to FIG. 1, the clock system includes:

a system on chip 100, configured to generate a first oscillation signal, a second oscillation signal, a third oscillation signal and a fourth oscillation signal of same frequency and amplitude, where the phase difference between the first oscillation signal and the second oscillation signal is 90°, the phase difference between the first oscillation signal and the third oscillation signal is 180°, and the phase difference between the first oscillation signal and the fourth oscillation signal is 270°; and a memory chip 200, configured to output a data signal based on rising edges of the first oscillation signal, the second oscillation signal, the third oscillation signal and the fourth oscillation signal. Specifically, the first oscillation signal, the second oscillation signal, the third oscillation signal and the fourth oscillation signal serve as read clocks/write clocks of the memory chip 200 to control the memory chip 200 to write/read data.

The memory chip 200 is further configured to output a command/address signal based on the rising edges of the first oscillation signal and the third oscillation signal. Specifically, the first oscillation signal and the third oscillation signal serve as command/address clocks of the memory chip 200 to control the memory chip 200 to control a command signal and an address signal.

Specifically, referring to FIG. 2, the memory chip 200 outputs the data signal based on sampling of the first oscillation signal, the second oscillation signal, the third oscillation signal and the fourth oscillation signal, such that the rate of the data signal is four times of the frequency of the first oscillation signal. The memory chip 200 outputs the command/address signal based on sampling of the first oscillation signal and the third oscillation signal, such that the frequency of the command/address signal is two times of the frequency of the first oscillation signal, thereby processing high-speed data with a clock signal of lower frequency.

In this embodiment, the first oscillation signal, the second oscillation signal, the third oscillation signal and the fourth oscillation signal of four different phases are generated by the system on chip. Assuming that the frequency of the first oscillation signal is about 1600 MHz, the data rate obtained by sampling the first oscillation signal, the second oscillation signal, the third oscillation signal and the fourth oscillation signal is about 6400 Mbps. The rate of the address/command signal obtained by sampling the first oscillation signal and the third oscillation signal is about 3200 Mbps, thereby processing the high-speed data with the clock signal of lower frequency. In addition, because the data is only sampled based on one of the rising edge and the falling edge, the duty cycle of the clock signal barely has effect on the eye diagrams of the read operation and the write operation, and there is no need to synchronize the clock signals, which is beneficial to subsequent improvement of read rate and write rate of the memory.

It should be noted that, in the description of this embodiment, it is described in detail by taking an example where the data signal and the command/address signal are outputted based on the rising edges of the first oscillation signal, the second oscillation signal, the third oscillation signal and the fourth oscillation signal, which does not constitute a limitation on this embodiment. In some embodiments, a correspondingly adjustment can be made as follows: the data signal is outputted based on the falling edges of the first oscillation signal, the second oscillation signal, the third oscillation signal and the fourth oscillation signal, and the command/address signal is outputted based on the falling edges of the first oscillation signal and the third oscillation signal. Whether the data signal and the command/address signal are outputted based on the rising edges or the falling edges of the first oscillation signal, the second oscillation signal, the third oscillation signal and the fourth oscillation signal, these embodiments fall within the protection scope of the present disclosure.

Still referring to FIG. 1, for the system on chip 100 provided by the embodiments, in some embodiments, the system on chip 100 includes: an oscillation generation unit 101 configured to generate an initial oscillation signal; and a signal generation module 102 connected to the oscillation generation unit 101, and configured to generate the first oscillation signal, the second oscillation signal, the third oscillation signal and the fourth oscillation signal based on the initial oscillation signal.

In one example, the oscillation generation unit 101 can generate the initial oscillation signal based on an annular oscillator. In another example, the oscillation generation unit 101 can generate the initial oscillation signal based on a crystal oscillator. Correspondingly, the crystal oscillator may be one of a quartz crystal resonator, a clock oscillator, a temperature-compensated crystal oscillator, a voltage-controlled crystal oscillator, or a constant-temperature crystal oscillator.

In some embodiments, referring to FIG. 3, the signal generation module 102 includes:

a phase detector 301, configured to detect a phase difference between the initial oscillation signal and an output signal of a voltage-controlled oscillator 303, and convert the phase difference to an initial voltage signal to output the initial voltage signal;

a low-pass filter 302, connected to the phase detector 301, and configured to filter the initial voltage signal to generate a control voltage signal;

the voltage-controlled oscillator 303, connected to the low-pass filter 302, and configured to adjust frequencies of the first oscillation signal, the second oscillation signal, the third oscillation signal and the fourth oscillation signal based on the control voltage signal; and a feedback divider 304, connected to the voltage-controlled oscillator 303 and the phase detector 301, and configured to adjust the frequency of the first oscillation signal to be N times the frequency of the first oscillation signal and then input the adjusted signal into the phase detector, where N is a positive number.

Specifically, the phase detector 301 generally consists of an analog multiplier. The initial oscillation signal is assumed as:

$$Ui(t)=Um*\text{Sin}[\omega it+\theta i(t)] \qquad (1)$$

The output signal of the voltage-controlled oscillator 303 is:

$$Uo(t)=Uom*\text{Cos}[\omega 0t+\theta 0(t)] \qquad (2)$$

ωi in equation (1) is an instantaneous oscillation angular frequency of the input signal, and ω0 in equation (2) is an oscillation angular frequency of the voltage-controlled oscillator 303 when the input control voltage is zero or when a direct-current voltage is inputted, which is called an inherent oscillation angular frequency of the voltage-controlled oscillator 303, θi (t) is an instantaneous phase of the initial oscillation signal, and θ0 (t) is an instantaneous phase of the output signal of the voltage-controlled oscillator 303.

The output of the phase detector 301 is:

$$\begin{aligned} Ud &= K*Ui(t)*Uo(t) \\ &= K*Um*Uom*\text{Sin}[\omega it+\theta i(t)]*\text{Cos}[\omega 0t+\theta 0(t)] \\ &= K/2*Um*Uom*\text{Sin}[\omega it+\theta i(t)+\omega 0t+\theta 0(t)]+K/2*Um* \\ &\quad Uom*\text{Sin}\{[\omega it+\theta i(t)]-[\omega 0t+\theta 0(t)]\} \end{aligned} \qquad (3)$$

In equation (3), a sum frequency component is filtered out by the low-pass filter 302, and a differential frequency component serves as the control voltage signal of the voltage-controlled oscillator 303.

The relationship between the instantaneous frequency and the instantaneous phase can be obtained according to a vector relationship:

$$\omega(t)=d\theta i(t)/dt \qquad (4)$$

What can be obtained by combining equation (3) and equation (4) is:

$$d\theta d/dt=d(\omega i-\omega 0)t/dt-d[\theta i(t)-\theta 0(t)]/dt \qquad (5)$$

θd in equation (5) is the phase difference between the initial oscillation signal and the output signal of the voltage-controlled oscillator 303.

When equation (5) is equal to 0, it indicates that the signal generation module 102 enters a phase-locked state, and at this time, the frequencies and phases of the initial oscillation signal and the output signal of the voltage-controlled oscillator 303 remain constant, and Ud is a constant value. When equation (5) is not equal to 0, it indicates that the signal generation module 102 is not in the phase-locked state, and at this time, the frequencies and phases of the initial oscillation signal and the output signal of the voltage-controlled oscillator 303 are different, and Ud changes with time.

The feedback divider 304 is arranged on a feedback path of the voltage-controlled oscillator 303, such that the frequency of the output signal of the voltage-controlled oscillator 303 is N times the frequency of the initial oscillation signal. Specifically, when N is set as a positive number greater than 1, the frequency of the output signal of the voltage-controlled oscillator 303 is amplified compared with the frequency of the initial oscillation signal; and when N is set as a positive number less than 1, the frequency of the output signal of the voltage-controlled oscillator 303 is reduced compared with the frequency of the initial oscillation signal.

Referring to FIG. 4, in some embodiments, the voltage-controlled oscillator 303 includes: a first inverter F1 having an input terminal connected to an input terminal of a fourth inverter F4 and an output terminal connected to an input terminal of a second inverter; the second inverter F2 having an input terminal configured to output one of the third oscillation signal and the fourth oscillation signal and an output terminal configured to output one of the first oscillation signal and the second oscillation signal; a third inverter F3 having an input terminal connected to the output terminal of the second inverter F2 and an output terminal connected to the input terminal of the fourth inverter F4; the fourth inverter F4 having an input terminal configured to output the other one of the third oscillation signal and the fourth oscillation signal and the output terminal configured to output the other one of the first oscillation signal and the second oscillation signal; a fifth inverter F5 having an input terminal connected to the output terminal of the fourth inverter F4 and an output terminal connected to the input terminal of the second inverter F2; a sixth inverter F6 having an input terminal connected to the output terminal of the second inverter F2 and an output terminal connected to the input terminal of the fourth inverter F4; a seventh inverter F7 having an input terminal connected to the output terminal of the third inverter F3 and an output terminal connected to the input terminal of the first inverter F1; and an eighth inverter F8 having an input terminal connected to the output terminal of the first inverter F1 and an output terminal connected to the input terminal of the third inverter F3.

The control voltage signal is configured to control delays of the first inverter F1, the second inverter F2, the third inverter F3, the fourth inverter F4, the fifth inverter F5, the sixth inverter F6, the seventh inverter F7 and the eighth inverter F8.

In an example of FIG. 4, the output terminal of the first inverter F1 outputs the third oscillation signal through a first output inverter S1, the output terminal of the second inverter F2 outputs the first oscillation signal through a second output inverter S2, the output terminal of the third inverter F3 outputs the fourth oscillation signal through a third output inverter S3, and the output terminal of the fourth inverter F4 outputs the second oscillation signal through a fourth output inverter S4. In other embodiments, also, the output terminal of the first inverter can directly output the first oscillation signal, the output terminal of the second inverter can directly output the third oscillation signal, the output terminal of the third inverter can directly output the second oscillation signal, and the output terminal of the fourth inverter can directly output the fourth oscillation signal.

In some embodiments, referring to FIG. 5, the system on chip 100 further includes: a first frequency divider 401 connected to the signal generation module 102, and configured to adjust a frequency of the initial oscillation signal to be R times the frequency of the initial oscillation signal and then input the adjusted signal into the signal generation module, where R is a positive number. By setting the first frequency divider 401, the frequencies of the first oscillation signal, the second oscillation signal, the third oscillation signal and the fourth oscillation signal are N/R times the frequency of the initial oscillation signal, such that the frequencies of the first oscillation signal, the second oscillation signal, the third oscillation signal and the fourth oscillation signal are flexibly adjusted. Specifically, when R is set as a positive number greater than N, the frequency of the output signal of the voltage-controlled oscillator 303 is reduced compared with the frequency of the initial oscillation signal; and when R is set as a positive number less than N, the frequency of the output signal of the voltage-controlled oscillator 303 is amplified compared with the frequency of the initial oscillation signal.

In some embodiments, the system on chip 100 further includes: a second frequency divider 402 connected to the signal generation module 102, and configured to adjust the frequencies of the first oscillation signal, the second oscillation signal, the third oscillation signal and the fourth oscillation signal to be O times the above frequencies and then output the adjusted signals, where O is a positive number. By setting the second frequency divider 402, the frequencies of the first oscillation signal, the second oscillation signal, the third oscillation signal and the fourth oscillation signal are N/O times the frequency of the initial oscillation signal, such that the frequencies of the first oscillation signal, the second oscillation signal, the third oscillation signal and the fourth oscillation signal are flexibly adjusted. Specifically, when O is set as a positive number greater than N, the frequency of the output signal of the voltage-controlled oscillator 303 is reduced compared with the frequency of the initial oscillation signal; and when O is set as a positive number less than N, the frequency of the output signal of the voltage-controlled oscillator 303 is amplified compared with the frequency of the initial oscillation signal.

In addition, by setting the first frequency divider 401 and the second frequency divider 402, the frequencies of the first oscillation signal, the second oscillation signal, the third oscillation signal and the fourth oscillation signal are N/(O*R) times the frequency of the initial oscillation signal, such that the frequencies of the first oscillation signal, the second oscillation signal, the third oscillation signal and the fourth oscillation signal are further adjusted. Specifically, when O*R is set as a positive number greater than N, the frequency of the output signal of the voltage-controlled oscillator 303 is reduced compared with the frequency of the initial oscillation signal; and when O*R is set as a positive number less than N, the frequency of the output signal of the voltage-controlled oscillator 303 is amplified compared with the frequency of the initial oscillation signal.

Still referring to FIG. 1, in some embodiments, the memory chip 200 includes: a signal conversion module 203 configured to adjust amplitudes of the first oscillation signal, the second oscillation signal, the third oscillation signal and the fourth oscillation signal, to correspondingly generate a first clock signal, a second clock signal, a third clock signal and a fourth clock signal; a first control module 201 connected to the signal conversion module 203, and configured to sample an initial data signal based on rising edges of the first clock signal, the second clock signal, the third clock signal and the fourth clock signal to output a data signal; and a second control module 202 connected to the signal conversion module 203, and configured to sample an initial command/address signal based on the rising edges of the first clock signal and the third clock signal to output a command/address signal.

The signal conversion module 203 adjusts the amplitudes of the first oscillation signal, the second oscillation signal, the third oscillation signal and the fourth oscillation signal, to correspondingly generate the first clock signal, the second clock signal, the third clock signal and the fourth clock signal, such that the first oscillation signal, the second oscillation signal, the third oscillation signal and the fourth oscillation signal serve as the clock signals of the memory chip 200 to control the generation of the data signal and the command/address signal.

In some embodiments, the first clock signal, the second clock signal, the third clock signal and the fourth clock signal are generated in a manner of differential input. Referring to FIG. 6, the signal conversion module 203 includes: a first driver Q1 configured to generate the first clock signal and the third clock signal based on the first oscillation signal and the third oscillation signal; and a second driver Q2 configured to generate the second clock signal and the fourth clock signal based on the second oscillation signal and the fourth oscillation signal. The first clock signal and the third clock signal generated in a manner of differential input are more accurate, thereby accurately controlling the generation of the data signal and the command/address signal by the memory chip 200.

The first driver Q1 includes: a first P-type transistor P1 having a gate configured to receive the third oscillation signal, a source connected to a drain of a third switching transistor K3, and a drain connected to a drain of a first N-type transistor N1; a second P-type transistor P2 having a gate configured to receive the first oscillation signal, a source connected to the drain of the third switching transistor K3, and a drain connected to a drain of a second N-type transistor N2; the first N-type transistor N1 having a gate connected to a drain of a fourth switching transistor K4 and the drain of the first P-type transistor P1, and a source grounded; the second N-type transistor N2 having a gate connected to the drain of the fourth switching transistor K4, a source grounded, and the drain connected to an output transmission line; the third switching transistor K3 having a gate configured to receive an enable signal and a source configured to receive a power voltage Vcc; the fourth switching transistor K4 having a gate configured to receive the enable signal and a source grounded; and the output transmission line configured to output the third clock signal and output the first clock signal through an output inverter S5.

Specifically, when the enable signal is at a high level, the third switching transistor K3 is turned off, and the fourth switching transistor K4 is turned on. At this time, no matter the inputs of the first oscillation signal and the second oscillation signal are at a high level or a low level, the first clock signal and the second clock signal outputted are at a low level. When the enable signal is at a low level, the third switching transistor K3 is turned on, and the fourth switching transistor K4 is turned off. At this time, if the first oscillation signal is at a high level, the third oscillation signal is at a low level, the first P-type transistor P1 is turned on, gate potentials of the first N-type transistor N1 and the second N-type transistor N2 are pulled up, and the second N-type transistor N2 is turned on, the level of the output transmission line is pulled down, the outputted third clock signal is at a low level, and the first clock signal is at a high level. If the first oscillation signal is at a low level, the third oscillation signal is at a high level, the second P-type transistor P2 is turned on, the level of the output transmission line is pulled up, the outputted third clock signal is at a high level, and the first clock signal is at a low level. In some embodiments, the first driver Q1 further includes: a first switching transistor K1 having a gate configured to receive the enable signal, a source configured to receive the power voltage Vcc, and a drain connected to a source of a first adjustment transistor T1; the first adjustment transistor T1 having a gate configured to receive a first adjustment signal and a drain connected to the drain of the third switching transistor K3; a second switching transistor K2 having a gate configured to receive the enable signal, a source configured to receive the power voltage Vcc, and a drain connected to a source of a second adjustment transistor T2; and the second adjustment transistor T2 having a gate configured to receive a second adjustment signal and a drain connected to the drain of the third switching transistor K3.

Specifically, when the enable signal is at a low level, the first adjustment transistor T1 is turned on by the first adjustment signal, thereby source voltages of the first P-type transistor P1 and the second P-type transistor P2 are increased; or, the second adjustment transistor T2 is turned on by the second adjustment signal, thereby the source voltages of the first P-type transistor P1 and the second P-type transistor P2 are increased.

The source voltages of the first P-type transistor P1 and the second P-type transistor P2 are increased by coordinately controlling the first switching transistor K1, the second switching transistor K2, the first adjustment transistor T1 and the second adjustment transistor T2, thereby the amplitudes of the first clock signal and the third clock signal are changed. In some embodiments, the gradient of the source voltages of the first P-type transistor P1 and the second P-type transistor P2 can be increased by changing the aspect ratio (width to length ratio) of the first adjustment transistor T1 and the second adjustment transistor T2. In some embodiments, the turn-on degrees of the first adjustment transistor T1 and the second adjustment transistor T2 can be controlled by changing the amplitude of the first adjustment signal and the second adjustment signal, thereby the gradient of the source voltages of the first P-type transistor P1 and the second P-type transistor P2 are increased.

In some embodiments, the first driver Q1 further includes: a first reset transistor W1 having a gate configured to receive a first reset signal, a source configured to receive the power voltage, and a drain connected to the output transmission line; and a second reset transistor W2 having a gate configured to receive a second reset signal, a source grounded, and a drain connected to the output transmission line.

Specifically, when the first reset signal is at a low level, the first reset transistor W1 is turned on, and the level of the output transmission line is pulled up; and when the second reset signal is at a high level, the second reset transistor W2 is turned on, and the level of the output transmission line is pulled down.

It should be noted that the structure of the second driver Q2 is the same as that of the first driver Q1. For the description of the second driver Q2, reference is made to the structure of the first driver Q1, which is not repeated again in this embodiment.

In some embodiments, the first clock signal, the second clock signal, the third clock signal and the fourth clock signal are directly generated correspondingly based on the first oscillation signal, the second oscillation signal, the third oscillation signal and the fourth oscillation signal. Referring to FIG. 8, the signal conversion module 203 includes: a first driver Q1 configured to generate the first clock signal based on the first oscillation signal; a second driver Q2 configured to generate the second clock signal based on the second oscillation signal; a third driver Q3 configured to generate the third clock signal based on the third oscillation signal; and a fourth driver Q4 configured to generate the fourth clock signal based on the fourth oscillation signal.

Referring to FIG. 9, the first control module 201 includes: a first data module 501 configured to receive the initial data signal, a first reference signal and the first clock signal, and compare the initial data signal with the first reference signal based on the rising edges of the first clock signal to generate the data signal; a second data module 502 configured to receive the initial data signal, the first reference signal and the second clock signal, and compare the initial data signal with the first reference signal based on the rising edges of the second clock signal to generate the data signal; a third data module 503 configured to receive the initial data signal, the first reference signal and the third clock signal, and compare the initial data signal with the first reference signal based on the rising edges of the third clock signal to generate the data signal; and a fourth data module 504 configured to receive the initial data signal, the first reference signal and the fourth clock signal, and compare the initial data signal with the first reference signal based on the rising edges of the fourth clock signal to generate the data signal.

Specifically, the first data module 501 is driven based on the rising edges of the first clock signal, the second data module 502 is driven based on the rising edges of the second clock signal, the third data module 503 is driven based on the rising edges of the third clock signal, and the fourth data module 504 is driven based on the rising edges of the fourth clock signal. The first data module 501, the second data module 502, the third data module 503 or the fourth data module 504 which are turned on generates the data signal based on comparison results between the initial data signal and the first reference signal.

In one example, if the level of the initial data signal is greater than or equal to the level of the first reference signal, the generated data signal is at a high level; and if the level of the initial data signal is less than the level of the first reference signal, the generated data signal is at a low level.

Referring to FIG. 10, the second control module 202 includes: a first command/address module 601 configured to receive the initial command/address signal, a second reference signal and the first clock signal, and compare the initial command/address signal with the second reference signal based on the rising edges of the first clock signal to generate the command/address signal; and a second command/address module 602 configured to receive the initial command/address signal, the second reference signal and the third clock signal, and compare the initial command/address signal with the second reference signal based on the rising edges of the third clock signal to generate the command/address signal.

Specifically, the first command/address module 601 is driven based on the rising edges of the first clock signal, and the second command/address module 602 is driven based on the rising edges of the third clock signal. The first command/address module 601 or the second command/address module 602 which are turned on generates the command/address signal based on comparison results between the initial command/address signal and the second reference signal.

In one example, if the level of the initial command/address signal is greater than or equal to the level of the second reference signal, the generated command/address signal is at a high level; and if the level of the initial command/address signal is less than the level of the second reference signal, the generated command/address signal is at a low level.

In some embodiments, the first reference signal and the second reference signal can be set based on a same reference level. In some other embodiments, reference levels of the first reference signal and the second reference signal can be set to be different levels.

It should be noted that, this embodiment is described specifically by taking an example where the output of the command/address signal is controlled by the first clock signal (first oscillation signal) and the third clock signal (third oscillation signal). In some embodiments, the output of the command/address signal can be controlled based on the second clock signal and the fourth clock signal.

In this embodiment, the first oscillation signal, the second oscillation signal, the third oscillation signal and the fourth oscillation signal which have four phases are generated by the system on chip. Assuming that the frequency of the first oscillation signal is about 1600 MHz, the data rate obtained after sampling based on the first oscillation signal, the second oscillation signal, the third oscillation signal and the fourth oscillation signal is about 6400 Mbps. After the address/command signal is sampled based on the first oscillation signal and the third oscillation signal, the rate of the address/command signal obtained is about 3200 Mbps, thereby the high-speed data processing can be realized with the clock signal of low frequency. In addition, because the data is only sampled at one of the rising edge and the falling edge, the duty cycle of the clock signal has little effect on the eye diagrams of the read operation and the write operation, and there is no need to synchronize the clock signals, which is beneficial to subsequent improvement of the read and write rate of the memory.

It should be noted that, the features disclosed in the clock system provided in the above embodiment can be arbitrarily combined without conflict, and new embodiments of the clock system can be obtained.

Another embodiment of the present disclosure provides a memory, constructed based on the clock system provided in the above embodiments, for outputting a data signal and a command/address signal. The effects of synchronization of the clock signals and the duty cycle on the reading and writing of the memory can be avoided and at the same time high-speed data processing can be realized with low-speed clock signals.

Specifically, the first oscillation signal, the second oscillation signal, the third oscillation signal and the fourth oscillation signal which have four phases are generated by the system on chip. Assuming that the frequency of the first oscillation signal is about 1600 MHz, the data rate obtained after sampling based on the first oscillation signal, the second oscillation signal, the third oscillation signal and the fourth oscillation signal is about 6400 Mbps. After the address/command signal is sampled based on the first oscillation signal and the third oscillation signal, the rate of the address/command signal obtained is about 3200 Mbps, thereby the high-speed data processing can be realized with the clock signal of low frequency. In addition, because the data is only sampled based on one of the rising edge and the falling edge, the duty cycle of the clock signal has little effect on the eye diagrams of the read operation and the write operation, and there is no need to synchronize the clock signals, which is beneficial to subsequent improvement of the read and write rate of the memory.

In some embodiments, the memory may be a memory cell or device based on a semiconductor device or component. For example, the memory device may be a volatile memory, for example, a dynamic random-access memory (DRAM), a synchronous dynamic random-access memory (SDRAM), a double data rate synchronous dynamic random-access memory (DDR SDRAM), a low-power double data rate synchronous dynamic random-access memory (LPDDR SDRAM), a graphics double data rate synchronous dynamic random-access memory (GDDR SDRAM), a double data rate type 2 synchronous dynamic random-access memory (DDR2 SDRAM), a double data rate 3 synchronous dynamic random-access memory (DDR3 SDRAM), a double data rate 4 synchronous dynamic random-access memory (DDR4 SDRAM), or a thyristor random-access memory (TRAM); or may be a non-volatile memory, for example, a phase-change random-access memory (PRAM), a magnetoresistive random-access memory (MRAM), or a resistive random-access memory (RRAM).

The embodiments or implementations of this specification are described in a progressive manner, and each embodiment focuses on differences from other embodiments. The same or similar parts between the embodiments may refer to each other.

In the description of this specification, the description referring to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail referring to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

Industrial Applicability

In the clock system and the memory provided in the embodiments of the present disclosure, the first oscillation signal, the second oscillation signal, the third oscillation signal and the fourth oscillation signal which have four phases are generated by the system on chip, thereby the high-speed data processing can be realized with the clock signal of low frequency. In addition, because the data is only sampled at one of the rising edge and the falling edge, the duty cycle of the clock signal has little effect on the eye diagrams of the read operation and the write operation, and there is no need to synchronize the clock signals, which is beneficial to subsequent improvement of the read and write rate of the memory.

What is claimed is:

1. A clock system, comprising:
   a system on chip (SoC), configured to generate a first oscillation signal, a second oscillation signal, a third oscillation signal and a fourth oscillation signal of same frequency and amplitude;
   wherein a phase difference between the first oscillation signal and the second oscillation signal is 90°, the phase difference between the first oscillation signal and the third oscillation signal is 180°, and the phase difference between the first oscillation signal and the fourth oscillation signal is 270°; and
   a memory chip configured to output a data signal based on signal edges of the first oscillation signal, the second oscillation signal, the third oscillation signal and the fourth oscillation signal, and further configured to output a command/address signal based on the signal edges of the first oscillation signal and the third oscillation signal, wherein the signal edges are rising edges or falling edges;
   wherein the memory chip comprises:
      a signal conversion module, configured to adjust amplitudes of the first oscillation signal, the second oscillation signal, the third oscillation signal and the fourth oscillation signal, to correspondingly generate a first clock signal, a second clock signal, a third clock signal and a fourth clock signal;
      a first control module, connected to the signal conversion module, and configured to sample an initial data signal based on signal edges of the first clock signal, the second clock signal, the third clock signal and the fourth clock signal to output the data signal; and
      a second control module, connected to the signal conversion module, and configured to sample an initial command/address signal based on the signal edges of the first clock signal and the third clock signal to output the command/address signal;
   wherein the second control module comprises:
      a first command/address module, configured to receive the initial command/address signal, a second reference signal and the first clock signal, and compare the initial command/address signal with the second reference signal based on the signal edge of the first clock signal to generate the command/address signal; and
      a second command/address module, configured to receive the initial command/address signal, the second reference signal and the third clock signal, and compare the initial command/address signal with the second reference signal based on the signal edge of the third clock signal to generate the command/address signal.

2. The clock system according to claim 1, wherein the SoC comprises:
   an oscillation generation unit, configured to generate an initial oscillation signal; and a signal generation module, connected to the oscillation generation unit, and configured to generate the first oscillation signal, the second oscillation signal, the third oscillation signal and the fourth oscillation signal based on the initial oscillation signal.

3. The clock system according to claim 2, wherein the signal generation module comprises:
   a phase detector, configured to detect a phase difference between the initial oscillation signal and an output signal of a voltage-controlled oscillator, and convert the phase difference between the initial oscillation signal and the output signal to an initial voltage signal and output the initial voltage signal;
   a low-pass filter, connected to the phase detector, and configured to filter the initial voltage signal to generate a control voltage signal;
   the voltage-controlled oscillator, connected to the low-pass filter, and configured to adjust frequencies of the first oscillation signal, the second oscillation signal, the third oscillation signal and the fourth oscillation signal generated based on the control voltage signal; and
   a feedback divider, connected to the voltage-controlled oscillator and the phase detector, and configured to adjust the frequency of the first oscillation signal to be N times the frequency of the first oscillation signal to obtain an adjusted signal and input the adjusted signal into the phase detector, wherein N is a positive number.

4. The clock system according to claim 3, wherein the voltage-controlled oscillator comprises:
   a first inverter, having an input terminal connected to an output terminal of a fourth inverter and an output terminal connected to an input terminal of a second inverter;
   the second inverter, having the input terminal configured to output one of the third oscillation signal or the fourth oscillation signal and an output terminal configured to output one of the first oscillation signal or the second oscillation signal;
   a third inverter, having an input terminal connected to the output terminal of the second inverter and an output terminal connected to an input terminal of the fourth inverter;
   the fourth inverter, having the input terminal configured to output other one of the third oscillation signal or the fourth oscillation signal and the output terminal configured to output other one of the first oscillation signal or the second oscillation signal;
   a fifth inverter, having an input terminal connected to the output terminal of the fourth inverter and an output terminal connected to the input terminal of the second inverter;
   a sixth inverter, having an input terminal connected to the output terminal of the second inverter and an output terminal connected to the input terminal of the fourth inverter;
   a seventh inverter, having an input terminal connected to the output terminal of the third inverter and an output terminal connected to the input terminal of the first inverter; and
   an eighth inverter, having an input terminal connected to the output terminal of the first inverter and an output terminal connected to the input terminal of the third inverter.

5. The clock system according to claim 2, wherein the SoC further comprises:
   a first frequency divider, connected to the signal generation module, and configured to adjust a frequency of the initial oscillation signal to be R times the frequency of the initial oscillation signal to obtain an adjusted signal and input the adjusted signal into the signal generation module, wherein R is a positive number.

6. The clock system according to claim 2, wherein the SoC further comprises:
   a second frequency divider, connected to the signal generation module, and configured to adjust frequencies of the first oscillation signal, the second oscillation signal, the third oscillation signal and the fourth oscillation signal to be O times the frequencies to obtain adjusted signals and output the adjusted signals, wherein the O is a positive number.

7. The clock system according to claim 1, wherein the signal conversion module comprises:
   a first driver, configured to generate the first clock signal and the third clock signal based on the first oscillation signal and the third oscillation signal; and
   a second driver, configured to generate the second clock signal and the fourth clock signal based on the second oscillation signal and the fourth oscillation signal.

8. The clock system according to claim 7, wherein the first driver comprises:
   a first P-type transistor, having a gate configured to receive the third oscillation signal, a source connected to a drain of a third switching transistor, and a drain connected to a drain of a first N-type transistor;
   a second P-type transistor, having a gate configured to receive the first oscillation signal, a source connected to the drain of the third switching transistor, and a drain connected to a drain of a second N-type transistor;
   the first N-type transistor, having a gate connected to a drain of a fourth switching transistor and the drain of the first P-type transistor, and a source grounded;
   the second N-type transistor, having a gate connected to the drain of the fourth switching transistor, a source grounded, and the drain connected to an output transmission line;
   the third switching transistor, having a gate configured to receive an enable signal and a source configured to receive a power voltage;
   the fourth switching transistor, having a gate configured to receive the enable signal and a source grounded; and
   the output transmission line, configured to output the third clock signal and output the first clock signal through an output inverter.

9. The clock system according to claim 8, wherein the first driver further comprises:
   a first reset transistor, having a gate configured to receive a first reset signal, a source configured to receive the power voltage, and a drain connected to the output transmission line; and
   a second reset transistor, having a gate configured to receive a second reset signal, a source grounded, and a drain connected to the output transmission line.

10. The clock system according to claim 7, wherein the first driver further comprises:
    a first switching transistor, having a gate configured to receive an enable signal, a source configured to receive a power voltage, and a drain connected to a source of a first adjustment transistor;

the first adjustment transistor, having a gate configured to receive a first adjustment signal and a drain connected to a drain of a third switching transistor;

a second switching transistor, having a gate configured to receive the enable signal, a source configured to receive the power voltage, and a drain connected to a source of a second adjustment transistor; and the second adjustment transistor, having a gate configured to receive a second adjustment signal and a drain connected to the drain of the third switching transistor.

11. The clock system according to claim 10, wherein the first driver further comprises:

a first reset transistor, having a gate configured to receive a first reset signal, a source configured to receive the power voltage, and a drain connected to an output transmission line; and a second reset transistor, having a gate configured to receive a second reset signal, a source grounded, and a drain connected to the output transmission line.

12. The clock system according to claim 1, wherein the signal conversion module comprises:

a first driver, configured to generate the first clock signal based on the first oscillation signal;

a second driver, configured to generate the second clock signal based on the second oscillation signal;

a third driver, configured to generate the third clock signal based on the third oscillation signal; and a fourth driver, configured to generate the fourth clock signal based on the fourth oscillation signal.

13. The clock system according to claim 1, wherein the first control module comprises:

a first data module, configured to receive the initial data signal, a first reference signal and the first clock signal, and compare the initial data signal with the first reference signal based on the signal edge of the first clock signal to generate the data signal;

a second data module, configured to receive the initial data signal, the first reference signal and the second clock signal, and compare the initial data signal with the first reference signal based on the signal edge of the second clock signal to generate the data signal;

a third data module, configured to receive the initial data signal, the first reference signal and the third clock signal, and compare the initial data signal with the first reference signal based on the signal edge of the third clock signal to generate the data signal; and a fourth data module, configured to receive the initial data signal, the first reference signal and the fourth clock signal, and compare the initial data signal with the first reference signal based on the signal edge of the fourth clock signal to generate the data signal.

14. A memory, constructed based on the clock system according to claim 1, for outputting the data signal and the command/address signal.

15. A clock system, comprising:

a system on chip (SoC), configured to generate a first oscillation signal, a second oscillation signal, a third oscillation signal and a fourth oscillation signal of same frequency and amplitude;

wherein a phase difference between the first oscillation signal and the second oscillation signal is 90°, the phase difference between the first oscillation signal and the third oscillation signal is 180°, and the phase difference between the first oscillation signal and the fourth oscillation signal is 270°; and a memory chip configured to output a data signal based on signal edges of the first oscillation signal, the second oscillation signal, the third oscillation signal and the fourth oscillation signal, and further configured to output a command/address signal based on the signal edges of the first oscillation signal and the third oscillation signal, wherein the signal edges are rising edges or falling edges;

wherein the SoC comprises:

an oscillation generation unit, configured to generate an initial oscillation signal; and a signal generation module, connected to the oscillation generation unit, and configured to generate the first oscillation signal, the second oscillation signal, the third oscillation signal and the fourth oscillation signal based on the initial oscillation signal;

wherein the signal generation module comprises:

a phase detector, configured to detect a phase difference between the initial oscillation signal and an output signal of a voltage-controlled oscillator, and convert the phase difference between the initial oscillation signal and the output signal to an initial voltage signal and output the initial voltage signal;

a low-pass filter, connected to the phase detector, and configured to filter the initial voltage signal to generate a control voltage signal;

the voltage-controlled oscillator, connected to the low-pass filter, and configured to adjust frequencies of the first oscillation signal, the second oscillation signal, the third oscillation signal and the fourth oscillation signal generated based on the control voltage signal; and a feedback divider, connected to the voltage-controlled oscillator and the phase detector, and configured to adjust the frequency of the first oscillation signal to be N times the frequency of the first oscillation signal to obtain an adjusted signal and input the adjusted signal into the phase detector, wherein N is a positive number;

wherein the voltage-controlled oscillator comprises:

a first inverter, having an input terminal connected to an output terminal of a fourth inverter and an output terminal connected to an input terminal of a second inverter;

the second inverter, having the input terminal configured to output one of the third oscillation signal or the fourth oscillation signal and an output terminal configured to output one of the first oscillation signal or the second oscillation signal;

a third inverter, having an input terminal connected to the output terminal of the second inverter and an output terminal connected to an input terminal of the fourth inverter;

the fourth inverter, having the input terminal configured to output other one of the third oscillation signal or the fourth oscillation signal and the output terminal configured to output other one of the first oscillation signal or the second oscillation signal;

a fifth inverter, having an input terminal connected to the output terminal of the fourth inverter and an output terminal connected to the input terminal of the second inverter;

a sixth inverter, having an input terminal connected to the output terminal of the second inverter and an output terminal connected to the input terminal of the fourth inverter;

a seventh inverter, having an input terminal connected to the output terminal of the third inverter and an output terminal connected to the input terminal of the first inverter; and an eighth inverter, having an input terminal connected to the output terminal of the first inverter and an output terminal connected to the input terminal of the third inverter.

16. A clock system, comprising:

a system on chip (SoC), configured to generate a first oscillation signal, a second oscillation signal, a third oscillation signal and a fourth oscillation signal of same frequency and amplitude;

wherein a phase difference between the first oscillation signal and the second oscillation signal is 90°, the phase difference between the first oscillation signal and the third oscillation signal is 180°, and the phase difference between the first oscillation signal and the fourth oscillation signal is 270°; and a memory chip configured to output a data signal based on signal edges of the first oscillation signal, the second oscillation signal, the third oscillation signal and the fourth oscillation signal, and further configured to output a command/address signal based on the signal edges of the first oscillation signal and the third oscillation signal, wherein the signal edges are rising edges or falling edges;

wherein the memory chip comprises:

a signal conversion module, configured to adjust amplitudes of the first oscillation signal, the second oscillation signal, the third oscillation signal and the fourth oscillation signal, to correspondingly generate a first clock signal, a second clock signal, a third clock signal and a fourth clock signal;

a first control module, connected to the signal conversion module, and configured to sample an initial data signal based on signal edges of the first clock signal, the second clock signal, the third clock signal and the fourth clock signal to output the data signal; and a second control module, connected to the signal conversion module, and configured to sample an initial command/address signal based on the signal edges of the first clock signal and the third clock signal to output the command/address signal;

wherein the signal conversion module comprises:

a first driver, configured to generate the first clock signal based on the first oscillation signal;

a second driver, configured to generate the second clock signal based on the second oscillation signal;

a third driver, configured to generate the third clock signal based on the third oscillation signal; and a fourth driver, configured to generate the fourth clock signal based on the fourth oscillation signal.

* * * * *